United States Patent [19]

Naden

[11] 4,070,651
[45] Jan. 24, 1978

[54] MAGNETIC DOMAIN MINOR LOOP REDUNDANCY SYSTEM

[75] Inventor: Rex Alan Naden, Richardson, Tex.

[73] Assignee: Texas Instruments Incorporated, Dallas, Tex.

[21] Appl. No.: 594,901

[22] Filed: July 10, 1975

[51] Int. Cl.² .............................................. G11C 19/08
[52] U.S. Cl. ...................................... 365/15; 365/94; 365/200
[58] Field of Search ................... 340/174 TF, 174 SR, 340/173 BB

[56] References Cited

U.S. PATENT DOCUMENTS

| B 499,718 | 1/1976 | Archer et al. | 340/174 TF |
| 3,659,275 | 4/1972 | Marshall | 340/173 BB |

FOREIGN PATENT DOCUMENTS

| 1,398,438 | 6/1975 | United Kingdom | 340/173 BB |

OTHER PUBLICATIONS

*Dynamic Redundancy & Repair System . . .*; Abrahamsen; pp. 2841–2843, IBM Tech. Discl. Bull.; vol., 17, #10; 3/75.

*Primary Examiner*—Marshall M. Curtis
*Attorney, Agent, or Firm*—James T. Comfort; Rene E. Grossman; William E. Hiller

[57] ABSTRACT

A magnetic domain memory system is provided that includes magnetic domain data chips having a major-minor loop organization wherein the system may include data chips having one or more defective minor loops. A programmable read-only memory (PROM) device is provided to permanently record locations of defective minor loops for each chip in the system. Logic circuitry is employed to inhibit transfer of magnetic domains into or out of a defective minor loop responsive to the data stored at each address location of the PROM. In one embodiment, each memory word location of the programmable read only memory denotes the number of minor loops between defective loops. In a different embodiment, each memory bit location of the programmable read only memory contains either a binary 1 or 0, depending upon whether the associated minor loop is operative or inoperative. In a further embodiment, a multiplex technique is described wherein parallel data lines provide access to a plurality of magnetic domain memory modules and a PROM is utilized to store the locations of all defective minor loops in the memory modules so as to prevent transfer of magnetic domains thereto.

11 Claims, 10 Drawing Figures

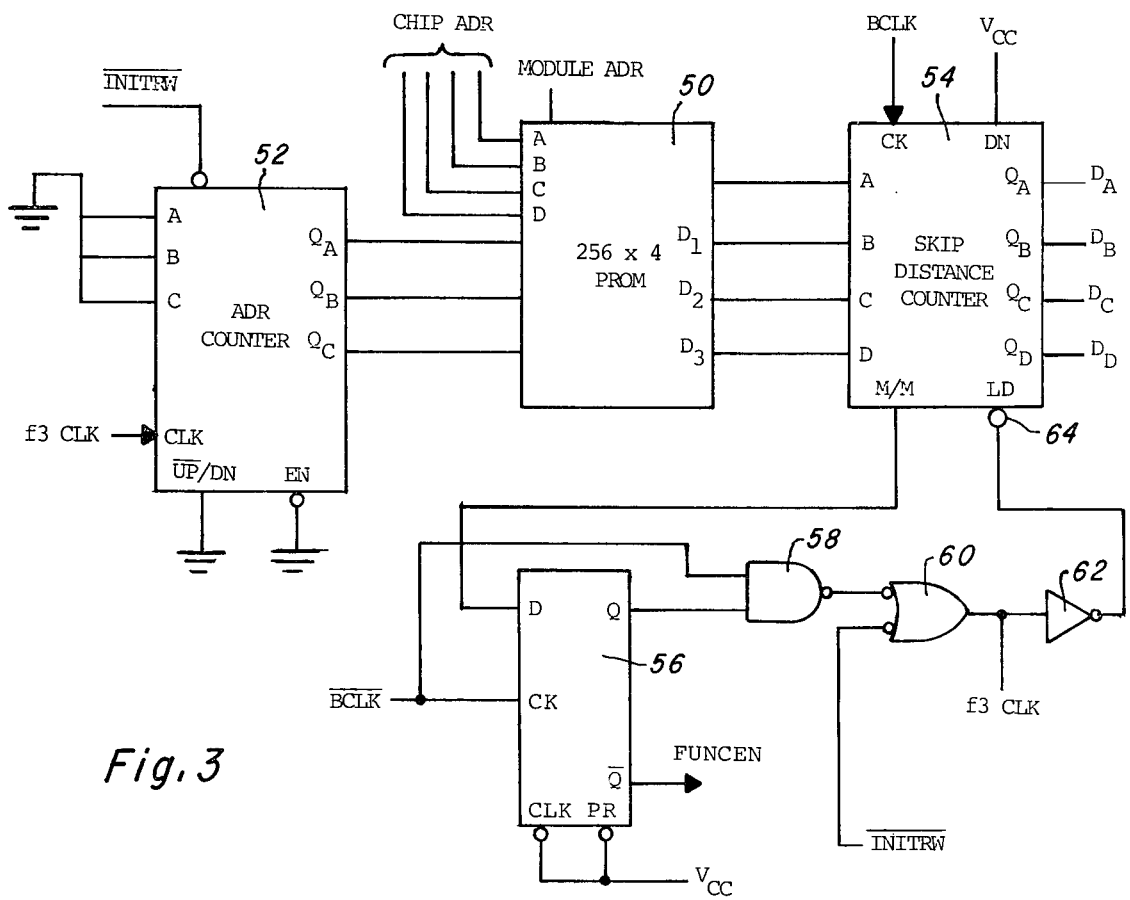
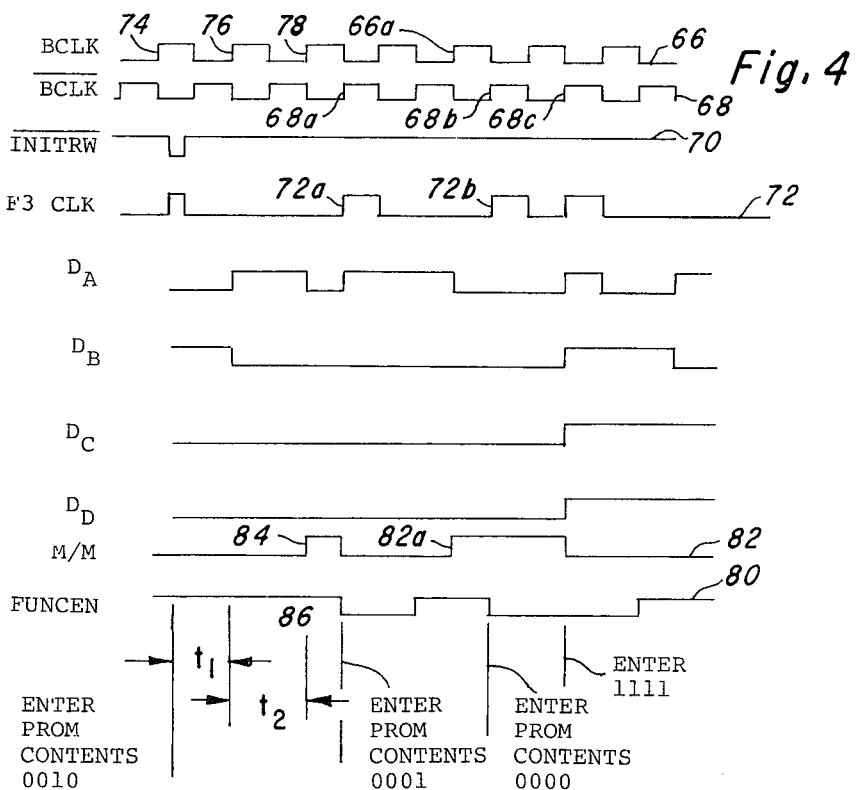
Fig. 3
Fig. 4

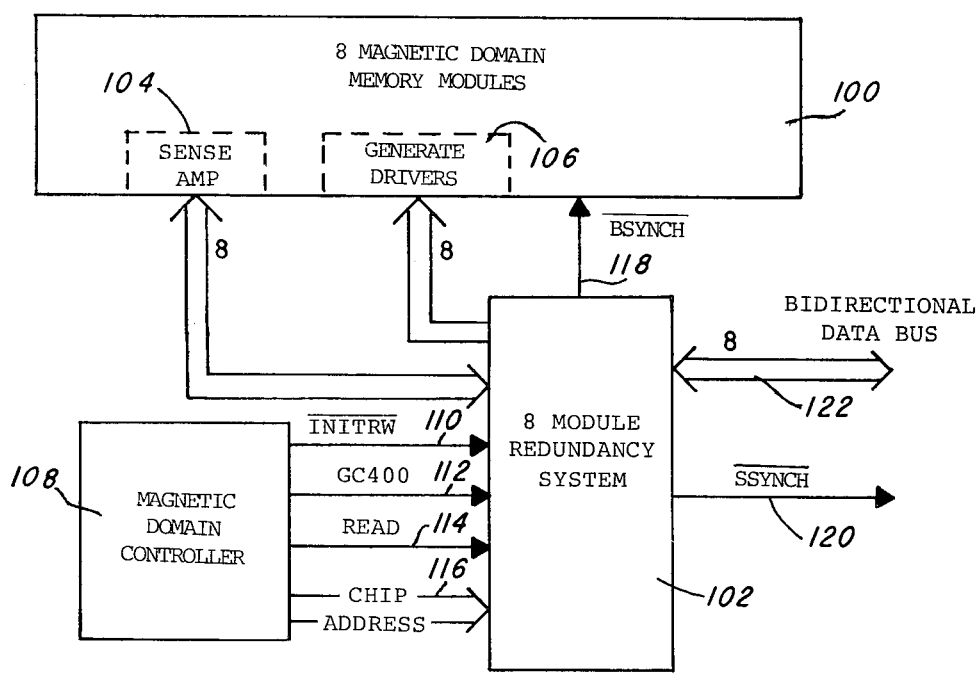

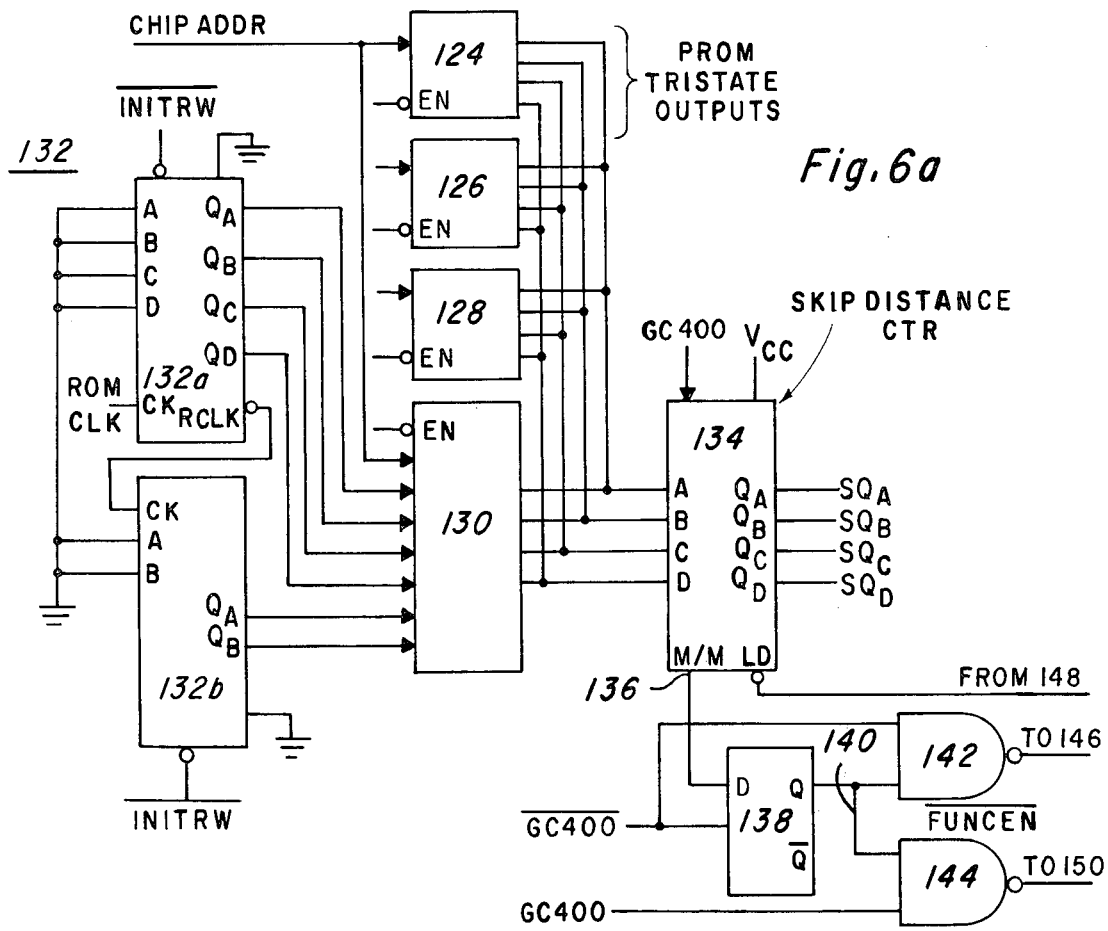
Fig. 6a
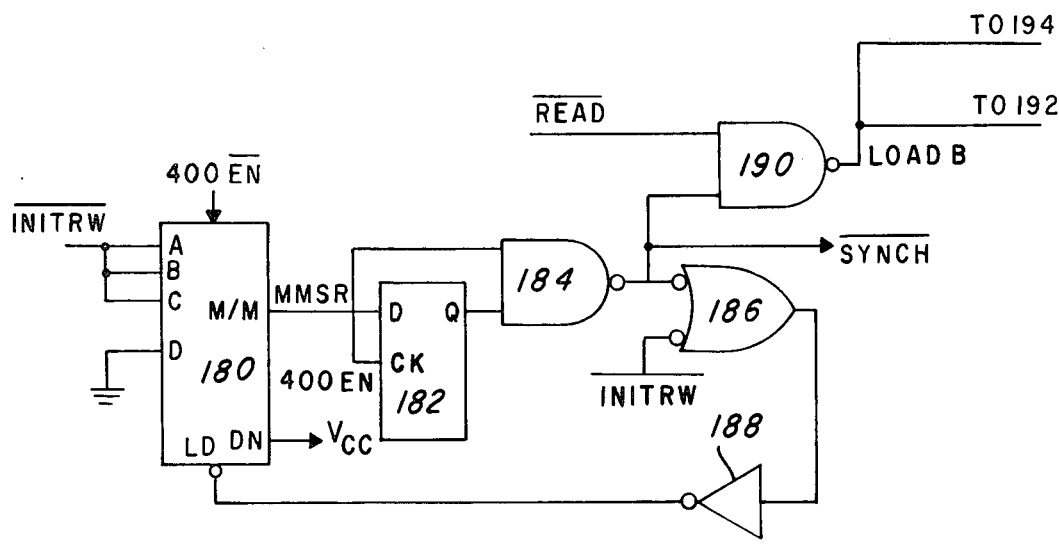

MAGNETIC DOMAIN MINOR LOOP REDUNDANCY SYSTEM

BACKGROUND OF THE INVENTION

1. Field of the Invention

The present invention pertains to magnetic cylindrical domain memory devices and more particularly to a system which permits utilization of magnetic domain chips having one or more defective portions which are incapable of propagating magnetic domains.

2. Description of the Prior Art

In recent years tremendous progress has been made in developing equipment for electronic data processing such that today high speed reliable hardware is available to the data processing designer. The newly developed electronic components, particularly those using integrated circuits, have greatly increased the capacity of modern electronic data processing equipment to process data. As the speed and capacity of processing has increased, the data storage requirements have also increased. At present several different techniques exist for storing large quantities of digital data including punched cards, punched tape, magnetic tape, magnetic drums, magnetic disc, and magnetic cores. In all of these types of storage, with the exception of magnetic cores and their solid state storage counterparts, a relatively long period of time is required for accessing any particular bit of data.

On the other hand, with random access type memories such as provided with magnetic cores and their semiconductor counterparts, any particular bit or word stored in the memory can be retrieved extremely fast, the time required to read any stored bit of information being only the time required for the electronic circuits to operate. However, increased speed has also resulted in increased costs. As a consequence, considering in general the memories discussed above, the cost per bit of information stored is cheapest with the slowest devices and most expensive with the fastest devices. Accordingly, there has been an effort to develop large capacity memories which are characterized by a large data access time but which are less expensive than magnetic cores and solid state storage configurations.

In this regard, significant interest has developed recently in a class of magnetic devices generally referred to as magnetic domain devices or "magnetic bubbles". These devices are described, for example, in *IEEE Transactions on Magnetics*, Vol. MAG - 5, No. 3 (1969), pp. 544 - 553, "Application of Orthoferrites to Domain - Wall Devices". These magnetic domain devices are generally planar in configuration and are constructed of materials which have magnetically easy directions which are essentially perpendicular to the plane of the structure. Magnetic properties such as magnetization anisotropy, coercivity, and mobility, are such that the device may be maintained magnetically saturated with magnetization in a direction out of the plane and that small localized single domain regions of magnetic polarization aligned opposite to the general polarization direction may be supported. Such localized regions which are generally cylindrical in configuration represent binary memory bits. Interest in these devices in large parts is based on the high density that can be obtained and the ability of the cylindrical magnetic domains to be independent of the boundary of the magnetic material in the plane in which it is formed and hence they are capable of moving anywhere in the plane of the magnetic material to effect various data processing operations.

A magnetic domain can be manipulated by programming currents through a pattern of conductors positioned adjacent the magnetic material or by varying the surrounding magnetic field. As an example, the magnetic domains may be formed in thin platelets having uniaxial anisotropy with the easy magnetic axis perpendicular to the plate comprising such materials as rare earth orthoferrites, rare earth aluminum and gallium substituted iron garnets and rare earth cobalt or iron amorphous alloys. Since the magnetic bubbles can be propagated, erased, replicated and manipulated to form data processing operations and their presence and absence detected, these bubbles may be utilized to perform the primary functions vital to memory operation.

Many structural organizations of operable magnetic domains have been disclosed in the literature. One of the most popular is the major-minor memory organization disclosed in U.S. Pat. No. 3,618,054. The major-minor loop memory organization as well as its implementation and operation is well known in the art. The major-minor loop organization includes a closed major loop which typically is established by an arrangement of T-bar permalloy circuits on, for example, a rare earth orthoferrite platelet. The magnetic domains are propagated around the loop by in-plane rotating magnetic field action. The major loop is generally elongated to permit a number of minor loops to be aligned along side it. Two way transfer gates permit the transfer of magnetic domains from the minor loop to the major loop and from the major loop to a minor loop. Further access to the major loop is achieved by a detect and read connection thereto and by a separate write connection.

The organization above described permits a synchronized domain pattern since propagation in the loops is synchronous with the rotation of the in-plane field. That is, parallel transfer of data domains from a plurality of minor loops may be made simultaneously to the major loop. Moreover, a plurality of data chips, each with a major loop and a plurality of associated minor loops, may be treated together. It is common to arrange such data chips in rows and then even to stack rows of data chips in time multiplexed layers to achieve complex memory structures, the data domains in all the loops and all the chips being synchronized with in-plane rotations.

Typically, all of the minor loops in the chip, upon command, transfer in parallel the bubbles from their correspoinding positions to the major loop. The bubbles are then serially detected as they are propagated past a read position. New data may also be inserted at a write position for parallel transfer back into the minor loops at an appropriate time later (when major loop magnetic domain propagation aligns the data for transfer).

Simultaneous reading/writing of data into a grouping of related major loops gives the capacity of treating related magnetic domains as digital or other coded words. Time multiplexed groups of data chips permits reading and writing of data in a time sharing fashion to permit an overall memory data rate greater than that permitted by magnetic domain propagation in a single chip.

Although a bubble memory system employing major-minor loops of the type described has numerous economic and operational advantages, unless special provision is made, every loop in every chip of the system must be perfect for the system to perform satisfactory.

Since chips contain entire groupings of registers, a defect in one of the minor loops would require discarding the entire chip. Various techniques have been proposed in the art for permitting use of a magnetic domain chip even through one or more of its minor loops may be defective. Exemplary techniques are described, for example, in co-pending patent application Ser. No. 445,694, filed Feb. 25, 1974 entitled "Bubble Memory Minor Loop Redundancy Scheme", now U.S. Pat. No. 3,909,810 issued Sept. 30, 1975, and "Fault-Tolerant Memory Organization: Impact on Chip Yield and System Cost", *IEEE Transactions Magnetics,* September, 1974. These techniques utilize a magnetic domain chip to store locations of defective loops. This technique, that is storing defective loop locations on a magnetic domain chip, is subject to loss of accuracy with time and it would be advantageous if defective loop location information could be stored on a permanent type memory.

Accordingly, it is an object of the present invention to provide an improved system of using major-minor magnetic domain organizations to permit the use of data chips having one or more faulty minor loops.

It is another feature of this invention to provide an improved major-minor magnetic domain memory system employing a programmable read-only memory for storing locations of defective minor loops.

It is yet another object of this invention to provide an improved major-minor loop magnetic domain memory system employing a programmable read-only memory as the means for preventing data from being inserted into or taken out of defective loops of a data chip.

SUMMARY OF THE INVENTION

A preferred magnetic domain memory system in accordance with the present invention includes a plurality of data chips each with a major loop, a plurality of minor loops, and transfer gates therebetween. The major-minor loop chip concept is not limited to the referenced arrangement disclosed in U.S. Pat. No. 3,618,054 but rather the concept is applicable to all memories comprised of multiple data loops which communicate with serial input/output tracks at at least one point of each data loop. Means, such as a rotating in-plane magnetic field, propagates the magnetic domains around the loops and pulsed conductor means are conventionally used to transfer the magnetic domains through the transfer gates on command. Each data chip contains at least one extra minor loop to provide redundancy in case there are one or more faulty or defective minor loops on the data chip. In accordance with a specific embodiment of the invention, a programmable read only memory is utilized to store data which identifies the relative position of defective loops on the chips. This data which is stored in the programmable read only memory is used to control logic so that a stream of data bubbles to be transferred in to the minor loops for storage contains intermittant voids corresponding to the defective minor loop locations. Accordingly, if there are at least as many redundant minor loops as there are defective loops, the chip can still be used.

In a preferred embodiment of the invention, a programmable read only memory stores binary data corresponding to the time delay between defective minor loops. The output word of the programmable read only memory is loaded into a counter which then counts to zero at which time an output pulse is provided to inhibit transfer of data. In a different embodiment of the invention, the programmable read only memory has a storage location associated with each minor loop in the data chips. The programmable read only memory stores either a logic 1 or a logic 0 corresponding to whether or not the associated minor loop is operative or defective.

BRIEF DESCRIPTION OF THE DRAWINGS

The above noted objects and features of the present invention as well as other objects, features and advantages of the invention will become more apparent upon a reading of the following detailed description taken in conjunction with the drawings wherein:

FIG. 3 is a block and logic diagram of a magnetic domain memory system illustrating use of a PROM in accordance with the present invention;

FIG. 4 is a timing diagram illustrating operation of the system shown in FIG. 3;

FIG. 5 is a simplified block diagram of an 8 bit multiplex scheme utilizing a programmable read only memory in accordance with the present invention to avoid defective minor loop storage locations;

FIGS. 6a and 6b comprise a composite logic diagram showing implementation of the simplified block diagram of FIG. 5;

DETAILED DESCRIPTION

Figure 1:
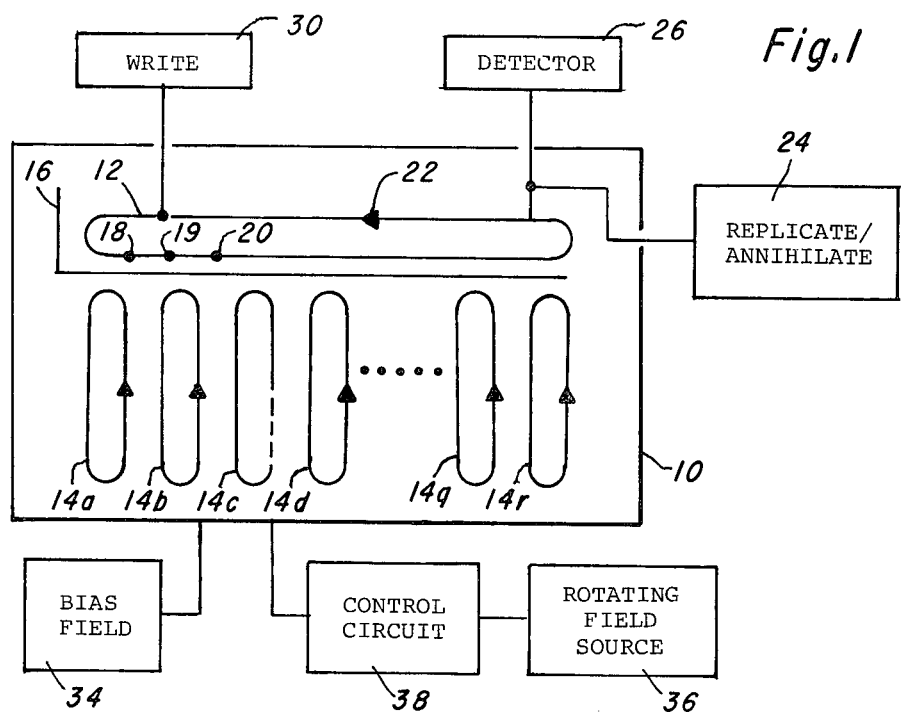
FIG. 1 is a diagram partly in block form and partly in schematic form of a data chip employed in a magnetic domain memory system in accordance with the present invention.

Referring now to the drawings and for the present particularly to FIG. 1, a major-minor magnetic domain memory organization is illustrated. Except for the presence of an illustrated defective minor loop, it is similar to the organization shown in U.S. Pat. Nos. 3,613,056, 3,618,054 and 3,729,726. The conditions for establishing single wall magnetic domains on suitable material 10 such as a rare earth orthoferrite platelet or a rare earth iron garnet film grown on a nonmagnetic sustrate are well known in the art. One article on the subject is the previously mentioned article appearing in the *IEEE Transactions of Magnetics,* Vol. MAG 5 - No. 3, 1969, pp. 544 – 553, hereby incorporated by reference. Patterns of magnetically soft overlay material (not shown), such as permalloy, shaped in bar and T-shaped segments are commonly employed to determine the loop pattern. One loop identified as major loop 12 closes on itself so that magnetic domains established in the loop circulate indefinitely provided they are not annihilated or transferred out.

Aligned adjacent major loop 12 are a series of identical minor loops 14a, 14b, 14c, 14d . . . 14q, 14r. Minor loop 14c is illustrated as having a defect as indicated by the broken line. For illustrative purposes, 18 minor loops have been shown although any number may be selected as desired for specific applications. One portion of each minor loop (that portion nearest to the major loop 12) acts as part of a two-way port or transfer gate 16 with the major loop. Transfer of domains through the loop may be accomplished by pulsing transfer line 16 which contains in a serially connected fashion all of the transfer gates between minor loops 14a – 14r and the major loop 12.

A transfer pulse applied to transfer line 16 causes magnetic domains or the absence of magnetic domains to pass from all of the minor loops to the major loop simultaneously. This parallel transfer signifies the transfer of a related data segment; i.e., word. In a similar manner, by altering the pulse current and timing, data may be transferred from the major loop in parallel back into the minor loops. As illustrated it is conventional that there is a data position between each of the magnetic domains transferred to the major loop; for example, bubble position 18 is shown opposite minor loop 14a, bubble position 19 is shown between loops 14a and 14b on the major loop and bubble position 20 is shown opposite minor loop 14b. Bubble positions 18, 19, and 20 are consecutive bubble positions on the major loop 12.

Once in the major loop, magnetic domains are circularly propagated in transfer direction 22 by an in-plane rotating magnetic field, each rotation signifying four steps in the T-bar advancement sequence as described, for example, in the U.S. Pat. No. 3,618,054. Replicate/annihilate means 24 may be attached to the major loop at a convenient position normally along the loop between the point at which magnetic domains propagate past the last of the minor loops, loop 14r and before the point at which they are re-introduced into the first of the minor loops 14a.

Also connected to the major loop is a detector circuit 26 and further a write circuit 30. The detector circuit 26 may be used to monitor the magnetic domain data sequence passing the point of the major loop to which connection is made via the replicate function. The write circuit can supply new data information as desired into the major loop 12 at the point where its connection is made.

A bias field supplied by the source 34 maintains single wall domains in the material 10 at nominal operating size as is well known. A rotating field source 36 may, for example, cause movement of the domains to occur in counter clockwise direction 22. As previously described, this movement occurs simultaneously in all loops. Finally the rotating field source 36 is under the control circuit 38 for activation and synchronization. The bias source 34, control circuit 38, rotating field source 36, and other auxiliary circuits such as a pulsing circuit for application to transfer line 16, counter circuits for tracking the magnetic domains in the loops and etc., are well known. Although not specifically illustrated in each case, such exemplary circuits may be used in connection with the illustrated embodiments as desired.

The magnetic domain memory organization illustrated in FIG. 1 shows 18 minor loops. In a typical device, however, it may be convenient to construct a data chip having 64 guaranteed good minor loops. Any desired number of redundant loops can be included on the chip. For purposes of illustration it is assumed that eight redundant loops are provided so that a total of 72 minor loops would be provided on a data chip. A programmable read only memory is utilized to store the location of defective loops. For example, a programmable read only memory having 256 four bit words, such as marketed by Texas Instruments Incorporated, Dallas, Tex., SN 74S287 can be utilized. Using a programmable read only memory having such a configuration, each word can be used to denote the number of loops between adjacent defective loops. Since four bits provide 16 binary combinations, each PROM word can specify a maximum of 16 spaces or minor loops between adjacent defective minor loop locations. In such an arrangement, if more than 16 spaces (i.e., minor loops) exist between defective loops, the logic circuit will inactivate a minor loop after 16 spaces even though this loop is not defective.

Since in the illustrated example each chip has eight redundant minor loops, eight words of the programmable read only memory are required for each chip. Assuming that there are 16 data chips per memory module, the data for identifying defective storage loops for one module can be stored in 128 programmable read only words or stated differently, one 256 word, 4 bit programmable read only memory can be utilized to store defective loop information for two memory modules, each including 16 data chips, eight minor loops on each chip not being utilized. For illustrative purposes, such a magnetic domain memory configuration is illustrated in block diagram in FIG. 2.

Figure 2:
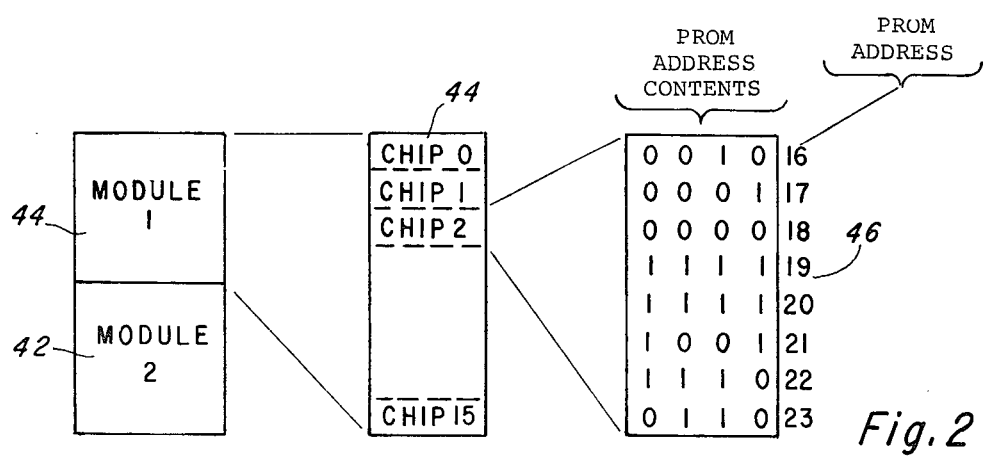
FIG. 2 is a block diagram illustration of a programmable read only memory organization useful in accordance with the present invention for preventing transfer of data between defective minor loops and the major loop of data chips in a memory system which includes modules of 16 data chips each.

With reference now to FIG. 2, two memory modules are shown at 40 and 42. Each module contains 16 data chips. As illustrated, module 1 contains chips 0 – 15 as shown at block 44. As previously described, each chip has eight memory locations or eight minor loops which are not utilized. The relative location of these defective loops is stored in a 256 word, 4 bit programmable read only memory. In the embodiment illustrated, memory addresses 0 – 7 of the programmable read only memory would be required for chip number 0. Memory locations 8 – 15 would be required for chip number 1 and programmable read only memory addresses 16 – 23 would be utilized for chip number 2, such as illustrated at 46. As shown generally at 46, for each of the programmable read only memory addresses 16 –23, a separate 4 bit binary code is stored by the PROM. For example, programmable read only memory address 16 has a binary word of 1110. For purposes of illustration, let it be assumed that six defective minor loops are contained in chip number 2 with relative locations of 3, 5, 6, 48, 63 and 70. As previously described, the programmable read only memory can be programmed with binary data corresponding to the number of minor loops between defective loops. The information required to be stored in each of the programmable read only addresses 16 – 23 of FIG. 2 in order to prevent data from being transferred into the defective loops 3, 5, 6, 48, 63 and 70 is shown in the table below.

TABLE I

| Defective Minor loop Locations | Unused Minor Loop Locations | Δn Between Unused Locations | Prom Contents in Binary Code (Δn−1) | Prom Address |
|---|---|---|---|---|
| 3 | 3 | 3 | 0010 | 16 |
| 5 | 5 | 2 | 0001 | 17 |
| 6 | 6 | 1 | 0000 | 18 |
| (skip) | 22 | 16 | 1111 | 19 |
| (skip) | 38 | 16 | 1111 | 20 |
| 48 | 48 | 10 | 1001 | 21 |
| 63 | 63 | 15 | 1110 | 22 |
| 70 | 70 | 7 | 0110 | 23 |

In this example, it is assumed that the contents of each address of the programmable read only memory are applied to a 16 bit counter which counts down from 15 to 0. The contents required to be stored at an address of the programmable read only memory can be determined by subtracting one from the number of minor loops between defective loop locations.

Thus, at address location 16 the contents of the programmable read only memory should be the binary equivalent of 2 since the third minor loop is assumed defective. The next defective minor loop occurs two locations later, i.e., minor loop location number 5. Accordingly, the programmable read only memory contents at location number 17 should be the binary equivalent of 1 since there are two minor loops between the first defective minor loop and the second defective minor loop. The programmable read only memory contents at location 18 should be a binary 0 because the next sequential minor loop 6 is also defective. It will be noted in the given example that the next defective loop does not occur until location number 48. It should further be recalled, however, that since each programmable read only memory address has only 4 data bits, The maximum number of that location can be skipped before a location is considered defective by the logic circuitry (i.e., the PROM, counter, etc.) is 16. Accordingly, the binary equivalent to 15 is entered in addresses 19 and 20 resulting in minor loops numbered 22 and 38 being inactivated. It can be seen that 10 minor loop locations exist between position number 38 and defective position number 48. Accordingly, the binary equivalent of 9 is entered in programmable read only memory address number 21. Similarly, the binary equivalent of 14 and 6 is stored respectively in programmable read only memory addresses 22 and 23 so that defective minor loop locations 63 and 70 are inactivated.

With reference now to FIGS. 3 and 4 there will be described a preferred embodiment for implementation of a magnetic domain memory system which utilizes a programmable read only memory to store the relative location of defective loops on a magnetic domain chip. FIG. 3 illustrates the logic diagram implementation and FIG. 4 illustrates timing diagrams suitable for use with FIG. 3.

With reference to FIG. 3, a programmable read only memory is shown at 50. A suitable programmable read only memory is marketed by Texas Instruments Incorporated, Dallas, Tex., SN 74S287. This programmable read only memory is a 256 word, 4 bit per word configuration, although any suitable configuration can be used. The programmable read only memory 50 receives inputs at terminals B, C, D and E from the chip address register, not shown. These signals identify one chip of the 16 chips contained in the two memory modules. Input A from the module address register identifies one of two modules. Inputs F, G and H to the programmable read only memory 50 are provided by an address counter 52. A suitable counter is marketed by Texas Instruments Incorporated, Dallas Tex. is SN 74191. The address counter has inputs A, B and C which are commonly tied together to ground. Upon application of a signal $\overline{INITRW}$ to the load terminal of the address counter 52, binary 0's are entered into the address counter and are present at outputs $Q_A$, $Q_B$ and $Q_C$. During operation then, the address counter 52 will sequentially apply inputs to the programmable read only memory 50 to select eight separate addresses. The address counter 52 will not provide a new address to the programmable read only memory 50 until application of a signal $f3$ CLK to the clock terminal of the address counter 52 (Signal $f3$ CLK is generated by logic circuitry described below).

The programmable read only memory has four output lines $D_0$, $D_1$, $D_2$ and $D_3$, which are applied to input terminals A, B, C and D of a skip distance counter 54. Any suitable address counter can be used; a suitable counter is marketed by Texas Instruments Incorporated, Dallas, Tex. SN 74191. In the present embodiment, the skip distance counter 54 counts down from the binary number applied to its inputs A, B, C and D from the programmable read only memory 50. When the count reaches 0 in the skip distance counter 54, a signal is generated at the M/M terminal of the counter 54. Counter 54 is clocked by a 50 KHz signal labeled B CLK.

The signal generated at the M/M terminal of counter 54 is applied to the D input of D-type edge triggered flip-flop 56. A suitable flip-flop is SN 7474 marketed by Texas Instruments Incorporated, Dallas, Texas. Flip-flop 56 is clocked by a 50 KHz signal labeled $\overline{B\ CLK}$, the inverse of B CLK. As understood by those skilled in the art, any suitable clock frequency can be used; it is typical in present day magnetic domain memory systems, however, to use a 50 KHz clock for data transfer operations for block-access chip architectures employing 100 KHz field drive frequencies. The Q output of flip-flop 56 is applied as one input to NAND gate 58. The other input to the NAND gate 58 is the clock signal $\overline{B\ CLK}$. A suitable NAND gate is SN 7400 marketed by Texas Instruments Incorporated, Dallas, Tex.

The output of the NAND gate 58 is applied to logic gate 60 which also can be a NAND gate SN 7400. A second input to the logic gate 60 is the signal $\overline{INITRW}$. The output of the logic gate 60 is the clock signal $f3$ CLK which is applied to the clock input of the address counter 52. The output of the logic gate 60 is applied to one terminal of a hex inverter 62 which may, for example, be SN 7404 marketed by Texas Instruments Incorporated, Dallas, Tex. The output of the hex inverter 62 is applied to the load input 64 of the skip distance counter 54.

Operation of the circuit illustrated in FIG. 3 can best be understood by reference to the timing diagram shown in FIG. 4. For ease in understanding the circuit illustrated in FIG. 3 and the manner in which the programmable read only memory contents are utilized in order to prevent transfer of magnetic domains into or out of defective minor loop locations, assume that the number of operative minor loops between defective loops in the magnetic domain chip are 2, 1, 0, and 16, respectively. For this condition, the programmable read only memory contents for addresses 0, 1, 2 and 3 would be 0010, 0001, 0000 and 1111, respectively.

With reference now to FIGS. 3 and 4, operation of the circuit is initiated by application of signal $\overline{INITRW}$ indicating that a "read" or a "write" operation is beginning. This signal is applied to the load input of the address counter 52 and also to one of the inputs of the logic gate 60. Application of this signal to the load input of the address counter 52 loads binary 0's into the address counter 52 so that logic 0's appear at outputs $Q_A$, $Q_B$ and $Q_C$, thereby selecting an address in the programmable read only memory 50. Application of the $\overline{INITRW}$ signal to one input of the gate 60 provides a signal to the load terminal 64 of the skip distance counter 54 enabling the contents of the programmable read only memory corresponding to the address selected by binary signals at $Q_A$, $Q_B$ and $Q_C$ to be loaded into the skip distance counter 54. In the present example, the contents of the first memory location of the programmable read only memory is 0010 corresponding to a skip distance of 2. These bits are loaded into inputs D, C, B, and A, respectively, of the skip distance counter 54, responsive to the signal at terminal 64.

With reference now to the waveforms illustrated in FIG. 4, the waveform of clock source BCLK utilized for clocking the skip distance counter 54 is illustrated at 66. This clock can be counted down from the 100 KHz clock that is used to operate the magnetic domain memory chips, and typically can be 50 KHz. The complement of this clock, labeled $\overline{BCLK}$ is shown at 68. The clock 68 is used to clock the flip-flop 56 and also provides one input to the NAND gate 58. Operation of the logic circuit shown in FIG. 3 is initiated by application of the signal 70 which is labeled $\overline{INITRW}$. Responsive to the signal 70, logic gate 60 generates $f3$ CLK signal 72 which is applied to the clock input of the address counter 52 permitting the logic 0 signals at input terminals A, B and C of the address counter 52 to be loaded into the address counter. Also responsive to the signal 70, a signal is applied to the load terminal 64 of the skip distance counter 54 such that the outputs $D_0$, $D_1$, $D_2$, and $D_3$ of the programmable read only memory 50 are entered into the skip distance counter. The binary word entered into the skip distance counter 54 from the programmable read only memory 50 appears at terminals $D_A$, $D_B$, $D_C$ and $D_D$ of the skip distance counter 54. As previously mentioned, the first address of the programmable read only memory 50 selected had binary word contents specifying a skip distance of two such that $D_D$ is binary 0, $D_C$ is binary 0, $D_B$ is a binary 1, and $D_A$ is a binary 0. The skip distance counter begins its count upon the leading positive edge of the clock 66. Accordingly, as illustrated in FIG. 4 the signal 70 is effective to load the skip distance counter 54 and upon the first positive going edge 74 of the clock 66, the counter immediately counts down to a binary equivalent of 2. Thus during time $t_1$, the counter 54 has a logic 0 at terminal $D_A$, a logic 1 at terminal $D_B$, and a logic 0 at terminals $D_D$ and $D_D$, representing a binary 2. At the next positive going edge 76 of clock 66, the counter 54 counts down to a binary 1, i.e., during time $t_2$ logic signal at terminal $D_A$ is a logic 1, while the logic signals at terminals $D_B$, $D_C$, $D_D$ are binary 0's. After the third positive going edge 78 of the clock 66, the counter 54 has counted down such that all of the terminals $D_A$, $D_B$, $D_C$ and $D_D$ are binary 0's. Upon the counter 54 counting down to 0, a signal is applied at the output terminals M/M which is connected to the D input of the flip-flop 56. The $\overline{Q}$ output of the flip-flop 56 is labeled FUNCEN and is shown as waveform 80. This function enable signal is applied to prevent transfer of data during the period of time that this signal is low. As shown by waveform 82, the M/M terminal of the counter 54 has an output pulse which is generated during the leading edge 78 of the clock 66 at which point in time the counter has counted down to 0. Responsive to the pulse 84 in waveform 82, a pulse 86 is generated in the function enable signal 80. The Q output of the flip-flop 56 and the positive going edge of the clock 68 gate on logic gates 58 and 60 so that an output is provided for the $f3$ CLK pulse as shown by waveform 72a. Additionally, responsive to application of the leading edge of the waveform 68, a load signal is applied to terminal 64 of the skip distance counter 54 so that the contents of the next address of the programmable read only memory 50 can be loaded into the skip distance counter 54. The next address of the programmable read only memory 50 is selected responsive to the $f3$ CLK pulse 72a being applied to the clock input of the address counter 52. As previously described, the second address of the programmable read only memory is to specify a skip distance of 1. Accordingly, for such a situation the logic level of terminals $D_A$, $D_B$, $D_C$ and $D_D$ of the skip distance counter 54 should be 1, 0, 0, and 0, respectively. This new binary code is entered into the counter responsive to the positive going edge 68a of clock 68. Upon application of pulse 66a, the counter 54 counts down to 0 and pulse 82a is generated at the output terminal M/M of the counter 54. Responsive to the pulse 82a, the function enable signal 80 goes low to prevent any transfer of data during that time frame to or from the magnetic domain memory. Again an output pulse 72b is generated and applied to the clock input of the address counter 52. At the beginning of the pulse 68b, the contents of the next memory location of the programmable read only memory 50 is read into skip distance counter 54. As previously described, the contents of this memory location should specify a skip distance of 0 so all 0's would be entered into inputs A, B, C and D of the skip distance counter 54 and correspondingly, the terminals $D_A$, $D_B$, $D_C$ and $D_D$ are all 0's at this time. Accordingly as previously described, an output is generated at the M/M terminal of the skip distance counter 54 which in turn causes flip-flop 56 to generate at the $\overline{Q}$ output a function enable signal which prevents any transfer of data during that time period. During pulse 68c of clock 68, the contents of the next PROM address are read into the skip distance counter 54. It will be recalled, that for this address it was desired to skip the maximum number of positions so all binary 1's are entered into the inputs A, B, C and D of the skip distance counter 54.

For convenience in description, entry of only four programmable read only memory address contents into the skip distance counter has been described. It will be understood, of course, that any desired number of defective loop locations can be entered into the programmable read only memory. For the preferred embodiment described, it has been assumed that for each magnetic domain memory chip, eight redundant minor loops would be provided. The actual number can very according to design requirements.

With reference to FIG. 5, there is a simplified block diagram of an 8 bit multiplex redundancy system. For convenience of illustration, an eight module system is described although it should be understood that the invention is not limited to such a specific configuration. In FIG. 5, eight modules of magnetic domain memories are illustrated generally at 100. The memory modules 100 are connected to an eight module redundancy system 102. Utilizing this configuration, data can be read from sense amps 104 in the memory modules in parallel and provided as parallel inputs to the redundancy system 102. For a write operation, data is read in parallel from the redundancy and data handling system 102 to generate drivers 106 contained in the magnetic domain memory modules 100. A magnetic domain controller 108 provides inputs to the redundancy and data handling system 102. These inputs initiate read or write signal 110, a 400 KHz clock 112, a read signal 114 and chip address inputs 116. The redundancy system 102 provides a bubble synch signal 118 to the magnetic domain memory module 100 and also provides a system synch signal 120 to the using system. A bidirectional data bus 122 provides parallel transfer of data between the redundancy system 102 and the using system.

In operation of the memory system illustrated in block diagram form in FIG. 5, for a read operation data including defective bits are received in parallel from the eight modules 100, the data is then serialized by the redundancy system 102 and is then repacked with defective bits deleted and then outputted in parallel along the data bus 122 to the using system. A programmable read only memory is contained within the redundancy system 102 to identify the locations of defective memory loops in the respective chips of each of the memory modules in the block 100, so that defective bits can be omitted and to insure, during a write operation, that data is not written into defective loops. During a write operation, logic 0's are written into each defective minor loop.

Figure 6B:
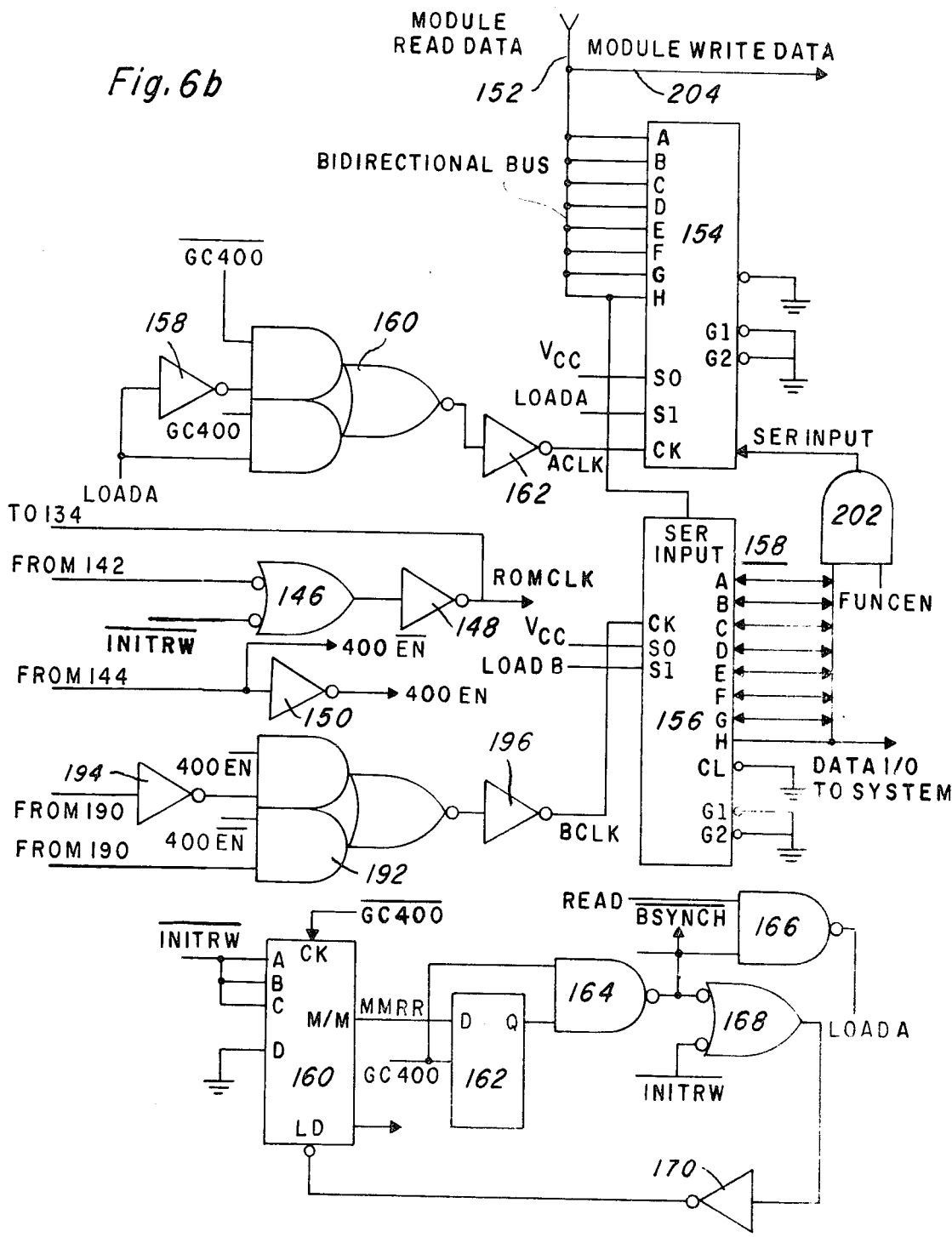
Figure 7:
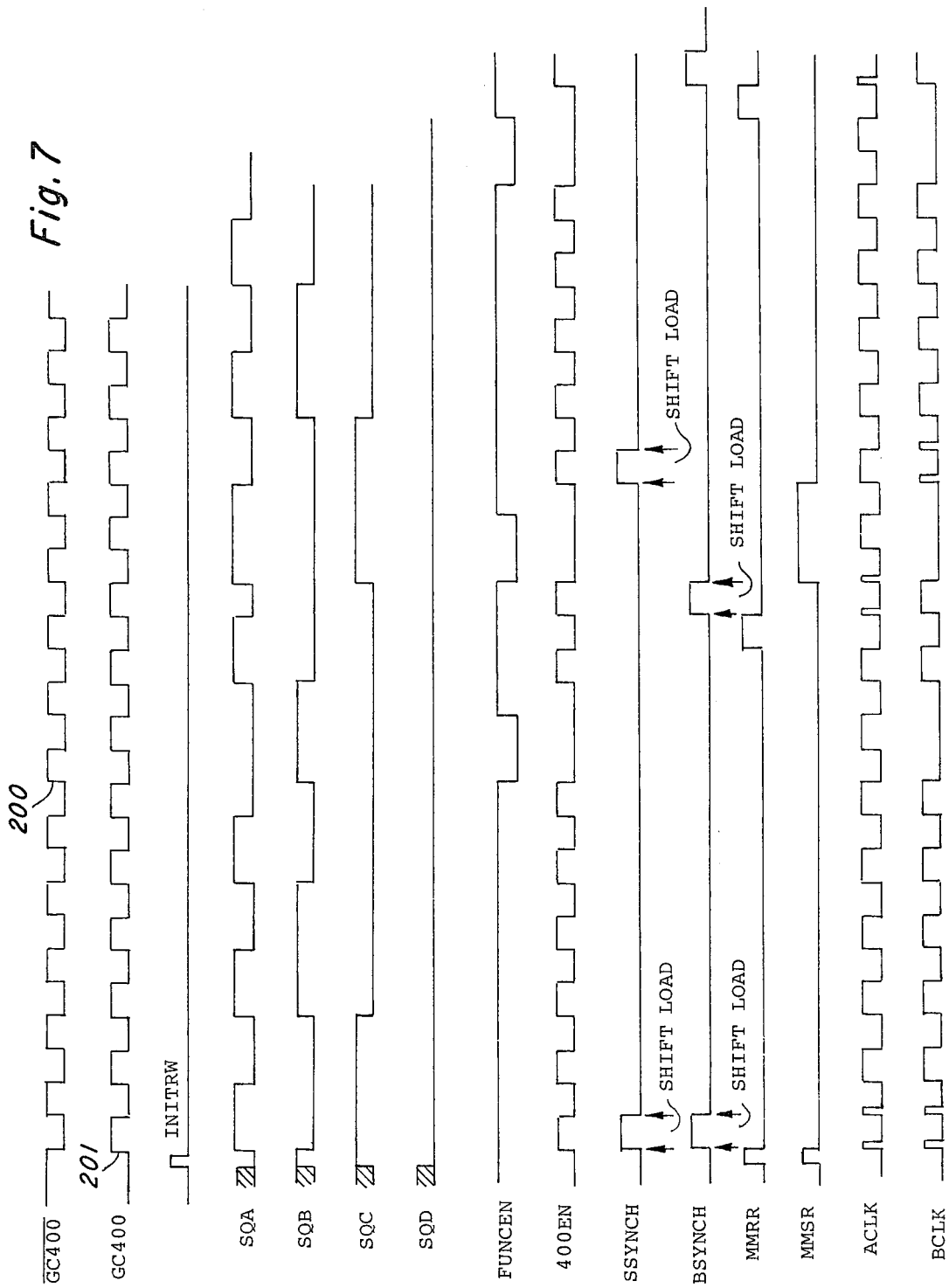
FIG. 7 illustrates waveforms suitable for operating the system illustrated in FIGS. 6a and 6b.
Figure 8:
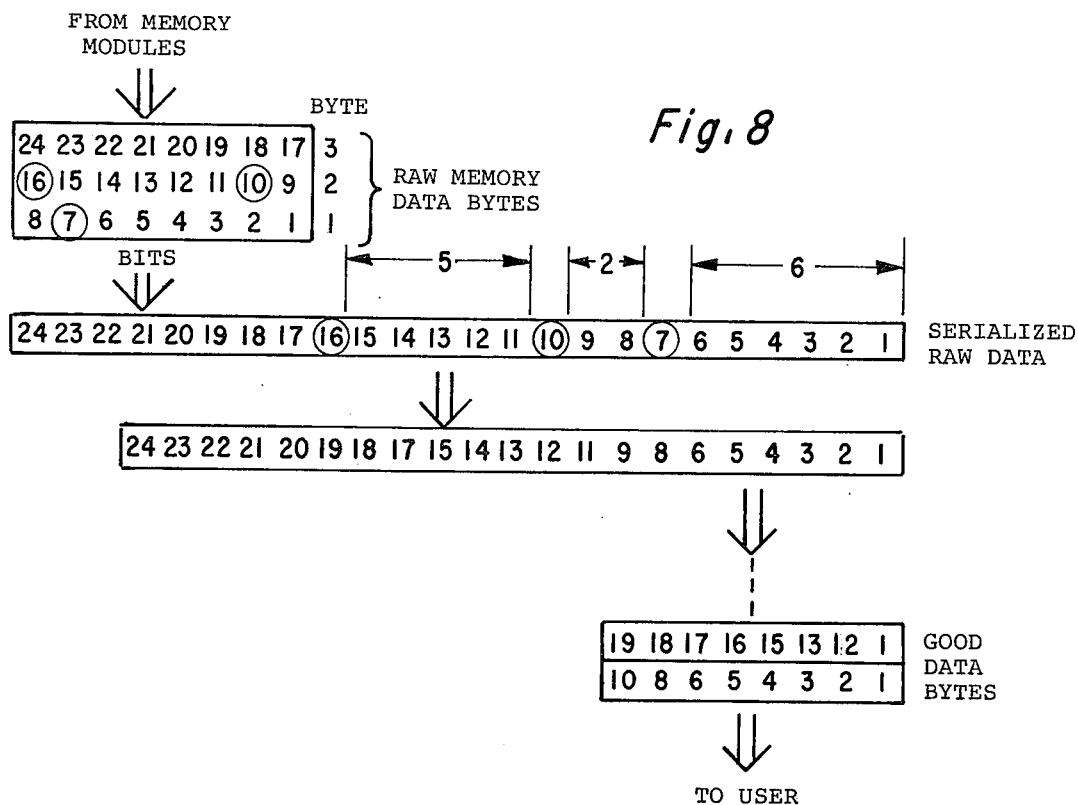
FIG. 8 diagrammatically illustrates processing of data during a read operation for the system described in FIGS. 5, 6a and 6b and 7.

Operation of the system described in general in FIG. 5 can better be understood by reference to FIGS. 6a, 6b 7 and 8 wherein FIGS. 6a and 6b comprise a composite logic diagram showing implementaion of the redundancy system; FIG. 7 illustrates waveforms suitable for operating the logic implementation of FIGS. 6a and 6b and FIG. 8 diagrammatically illustrates the multiplexed processing of data between the memory modules 100 and the using system during a read operation wherein defective bits are eliminated. The processing for a write operation is analogous and is not illustrated.

With reference now to FIGS. 6a and 6b, four 256 by four bit programmable read only memories are illustrated in FIG. 6a at 124, 126, 128, and 130. These programmable read only memories may respectively be SN 74S287 marketed by Texas Instruments Incorporated, Dallas, Tex. These four programmable read only memories are utilized to store information concerning the relative location of defective minor loops in each of the data chips contained in the eight magnetic domain memory modules illustrated in block 100 in FIG. 5. Assuming 16 data chips per module, there are 128 data chips in the block 100. Assuming that each of the data chips can have eight defective loops, a total of 128 × 8 or 1024 address or storage locations in the programmable read only memory are required. This number of locations is supplied by using the four programmable read only memories 124, 126, 128, and 130, each having 256 storage words. The address register for the PROM's is illustrated at 132 and in the present embodiment includes two counters, 132a and 132b, which are connected together for providing six output signals to the programmable read only memory. Suitable devices for counters 132a and 132b are marketed by Texas Instruments Incorporated, Dallas, Tex. as SN 74191. Two chip address inputs are applied to each of the programmable read only memories. Since parallel operation is involved and since eight separate chips are addressed simultaneously and since each chip has eight possible defective locations, a total of 64 memory locations are required for each read or write operation. Six outputs from the counter 132 provide 64 separate addresses to the programmable read only memory. The outputs from the programmable read only memory are applied to the A, B, C and D inputs of the skip distance counter 134. A suitable counter is SN 74191 marketed by Texas Instruments, Dallas, Tex. This counter is clocked by a signal GC400 which typically would be a 400 KHz clock for 100 KHz field drive frequency. It will be recalled that a typical data rate for a single magnetic domain memory chip is 50 KHz. Since the present embodiment multiplexes eight chips, it can be seen that eight times 50 or 400 KHz clock frequency is required.

The counter 134 operates in conjunction with the programmable read only memories in a manner similar to that described with respect to operation of the circuit illustrated in FIG. 3. A M/M output 136 from the skip distance counter 134 is applied to the D input of a flip-flop 138. Flip-flop 138 is clocked by a signal $\overline{GC400}$. The Q output of flip-flop 138 provides a function enable signal 140, labeled $\overline{FUNCEN}$ which is applied as one input to each of the NAND gates 142 and 144. The other input of NAND gate 142 is the clock $\overline{GC400}$ and the other input to the NAND gate 144 is the signal GC400. The output of NAND gate 142 is connected to one input of the logic gate 146, the other input of which is provided by the initiate read or write signal $\overline{INITRW}$. The output of logic gate 146 is applied to a hex inverter 148, the output from this inverter being the clock signal "ROM CLK" which is applied to the clock input of the address register 132. It is also applied to the load input of the skip distance counter 134. The output of the logic NAND gate 144 provides a clock signal 400 $\overline{EN}$ and after going through hex inverter 150, the clock 400 EN. The signals $\overline{FUNCEN}$, 400 $\overline{EN}$ are used to control transfer of data between the magnetic domain data chips and a using system as will be described below. Suitable devices for the logic gates 142, 144 and 146 are marketed by Texas Instruments Incorporated Dallas, Tex., as SN 7400. Suitable hex inverters are Texas Instruments Incorporated, Dallas Tex., SN 7404. A suitable flip-flop 138 is Texas Instruments Incorporated, Dallas, Tex., SN 7474.

As shown in FIG. 5, a parallel bus connects a data chip in each of the eight magnetic domain memory modules to the redundancy system 102. This is illustrated in FIG. 6b wherein the parallel bus 152 is connected to inputs A–H or an eight bit shift register 154. A suitable shift register is marketed by Texas Instruments Incorporated, Dallas, Tex., as SN 74S299. In a read operation, data from the sense amplifiers of a magnetic domain data data chip in each of the eight modules is read in parallel along the parallel data bus 152 and simultaneously applied to inputs A–H of the shift register 154. The data can, of course, include some defective bits if the minor loop in any one of the eight magnetic domain bubble chips then being read is defective. The data is shifted in serial from shift register 154 into shift register 156. This transfer is initiated by application of a LOAD A signal to one input of the shift register 154. This signal enables data to be transferred in parallel from the eight memory modules into the shift register 154. The LOAD A input signal is also applied to hex inverter 158 and to one terminal of the AND/OR invert gate shown generally at 160. A suitable AND/OR invert gate is marketed by Texas Instruments Incorporated, Dallas, Tex., as SN 7451. Other inputs to the AND/OR invert gate 160 include the clock GC400, the output of the hex inverter 158, and the clock $\overline{GC400}$. The output of the AND/OR invert gate 160 is applied to a hex inverter 162, the output of which is used to provide the clock signal A CLK which is applied to the clock input terminal of the shift register 154. The signal CLK is shown in FIG. 7.

Data is clocked into shift register 156 serially responsive to the clock input provided by the signal B CLK.

The B CLK waveform is also illustrated in FIG. 7. This waveform is modulated by the contents of the programmable read only memory so that a clock signal is eliminated for those locations corresponding to defective storage loops in the magnetic domain data chips. In other words, data is entered into shift register 154 in parallel from the magnetic domain memory modules. Assume for purposes of illustration that one of these eight bit corresponds to a defective minor loop in one of the data chips in the memory modules. After the data is loaded in parallel into the shift register 154, it is shifted serially into the shift register 156. When the data bit that is defective is attempted to be shifted into shift register 156, the B CLK clock signal is inhibited responsive to the contents of the programmable read only memory which indicates that that bit is defective and thereby the defective data bit is not entered into the shift register 156. Once eight good data bits are entered into the shift register 156, they are shifted out in parallel along a parallel along a parallel bus shown generally at 158 to the using system.

The LOAD A signal which is used to initiate loading of register 154 during a read operation is generated responsive to the bubble synch register counter 160 which may, for example, be Texas Instruments Incorporated, Dallas, Tex., SN 74191. This counter is started responsive to the signal $\overline{\text{INITRW}}$ which is supplied to the input terminals A, B, and C thereof. It is clocked by the clock signal $\overline{\text{GC400}}$. The M/M output of counter 160 is applied to the D input of flip-flop 162 which is clocked by signal GC400. The GC400 clock provides one input to the NAND gate 164, the other input of which is the Q output of the flip-flop 162. The output of the NAND gate 164 is the signal $\overline{\text{BSYNCH}}$, the waveform of which is illustrated in FIG. 7. This $\overline{\text{BSYNCH}}$ signal is applied as one input to the NAND gate 166, the other input of which is the READ input signal. When both of these signals are present, the NAND gate 166 provides the LOAD A output signal which enables loading parallel data into register 154. The output of NAND gate 164 is also applied as one input to the logic gate 168, the other input of which is the signal $\overline{\text{INITRW}}$. The output of logic gate 168 is applied to a hex inverter 170 and back to the load input of the counter 160.

The system synch signal $\overline{\text{SSYNCH}}$, BCLK (for clocking shift register 156) and LOAD B signal (for loading shift register 156) are provided by the system synch register counter 180, an associated logic. The A, B and C inputs to counter 180 receive the input $\overline{\text{INITRW}}$. Counter 180 is clocked by the signal 400 $\overline{\text{EN}}$ which is provided by the output of the logic NAND gate 144 responsive to control by the programmable read only memories 124, 126, 128 and 130 and the associated skip distance counter 134. The M/M output of the counter 180 is applied to the D input of flip-flop 182. Flip-flop 182 is clocked by the signal 400 EN. The waveform for signal 400 EN is illustrated in FIG. 7. The Q output of flip-flop 182 and the clock 400 EN form the two inputs to NAND gate 184, the output of which is the control signal $\overline{\text{SSYNCH}}$. This signal along with the signal $\overline{\text{INITRW}}$ form inputs to the logic gate 186 which is applied to hex inverter 188, the output of which is applied back to the load terminal of counter 180. The $\overline{\text{SSYNCH}}$ signal also is applied as one input to the NAND gate 190, the other input of which is the $\overline{\text{READ}}$ signal. The output of logic gate 190 is the control signal LOAD B which is applied to the shift register 156. The LOAD B signal forms one input for the AND/OR invert gate 192. Another input of this device is the signal 400 $\overline{\text{EN}}$ and 400 EN. The LOAD B signal is also applied to a hex inverter 194, the output of which forms the final input to the AND/OR invert gate 192. The output of the AND/OR invert gate 192 is applied to a hex inverter 196, the output of which is the control signal BCLK which is applied to the clock input of the shift register 156.

For purposes of illustration of operation of the embodiment illustrated in FIGS. 6a and 6b, reference is made to waveforms in FIG. 7 and FIG. 8. For illustration only, in FIG. 8 three bytes of parallel data from the memory modules are shown, the first byte having a defective minor loop in bit location number 7 and the second byte having defective minor loop locations a bit numbers 9 and 14. For illustration, a read operation will be described. The magnetic domain controller 108 illustrated in FIG. 5 will provide to the logic circuitry of FIGS. 6a and 6b the signals 110, 112, 114 and 116 which are $\overline{\text{INITRW}}$, GC400, READ and CHIP ADDRESS. Responsive to these signals, the LOAD A and $\overline{\text{BSYNCH}}$ signals will be generated at the outputs of logic gates 166 and 164, respectively, and eight bits of data will be read in parallel into the shift register 154. As shown in FIG. 8, the first eight bits or byte 1 contains a defective bit at location number 7. Transfer of any information from bit location number 7 to the user is prevented by the programmable read only memory 124 – 130. The address register 132 will have provided signals to the programmable read only memory selecting addresses corresponding to the data being read from the memory modules. The first address of the programmable read only memory will contain four bits of binary data corresponding to a skip distance of 6. In other words, after the data is shifted in parallel into the shift register 154 it is serially shifted into shift register 156. It is desired during this serial transfer of data to prevent any transfer of data corresponding to the 7th bit location. The binary data stored by the first address of the programmable read only memory is effective to provide a signal which will prevent transfer of data into the shift register 156 for the bit corresponding to bit number 7 in the present example, as will be explained below.

With reference to FIG. 7, it can be seen that upon application of the initiate read/write signal, $\overline{\text{INITRW}}$, a binary 6 is loaded into the skip distance counter 134. That is, in FIG. 7 the logic levels at terminals $SQ_A$, $SQ_B$, $SQ_C$ and $SQ_D$ of counter 134 are, respectively, 0, 1, 1, 0 which corresponds to a logic 6. Upon the first positive going edge 201 of the clock GC400, the counter counts down to a binary 5 as can be seen since $SQ_A$, $SQ_B$, $SQ_C$, $SQ_D$ are, respectively, logic 1, 0, 1, 0. The counter 134 continues to count down one count each positive going edge of the clock GC400 until the counter counts down to 0 at which time an output signal is provided from the skip distance counter 134 at the output M/M terminal 136 to the D input of the flip-flop 138. At the next positive going edge 200 of the clock $\overline{\text{GC400}}$, the signal FUNCEN goes low and the clock signal 400 EN produced at the output of hex inverter 150 is blanked out for one pulse. This in turn blanks out the BCLK pulse for one cycle so that during the time interval when the 7th bit of data would be transferred from shift register 154 to 156, a clock signal is not available at the input of shift register 156.

Also responsive to the positive going edge 200 of clock $\overline{\text{GC400}}$, the contents of the second programmable read only memory address are read into the skip distance counter 134. The digital data at this memory location is 0010 corresponding to a skip distance of 2. As can be seen with reference to FIG. 8, two memory locations must be skipped; data bit location 7 and data bit location 8, prior to the next defective location which is located at position 9. Again, after two bits of data are clocked from shift register 154 to 156, the function enable signal FUNCEN again goes low and a BCLK pulse is prevented so that data is not transferred into shift register 156. It can be seen then that only good data bits are transferred to the shift register 156. These good data bits are then transferred in parallel to the user.

A write operation works in a similar manner except that data from the user system is applied to the shift register 156. The data is shifted serially to the shift register 154 through the AND gate 202. The other input of the AND gate is the signal FUNCEN which in turn is generated responsive to the skip distance between defective bits in the magnetic domain chips of the memory modules. For this situation, since the data is shifted in parallel from the shift register 154 to the module write data parallel bus 204, a logic 0 is inserted for memory locations associated with a defective minor loop on one of the magnetic data chips.

A suitable device for each AND gate illustrated is SN 7400 marketed by Texas Instruments Incorporated, Dallas, Tex. Suitable hex inverters are Texas Instruments SN 7404; suitable flip-flops are Texas Instruments SN 7474; suitable omitters are Texas Instruments SN 74191; suitable shift registers are Texas Instruments SN 74S299; and suitable AND/OR inverters are Texas Instruments SN 7451.

Figure 9:
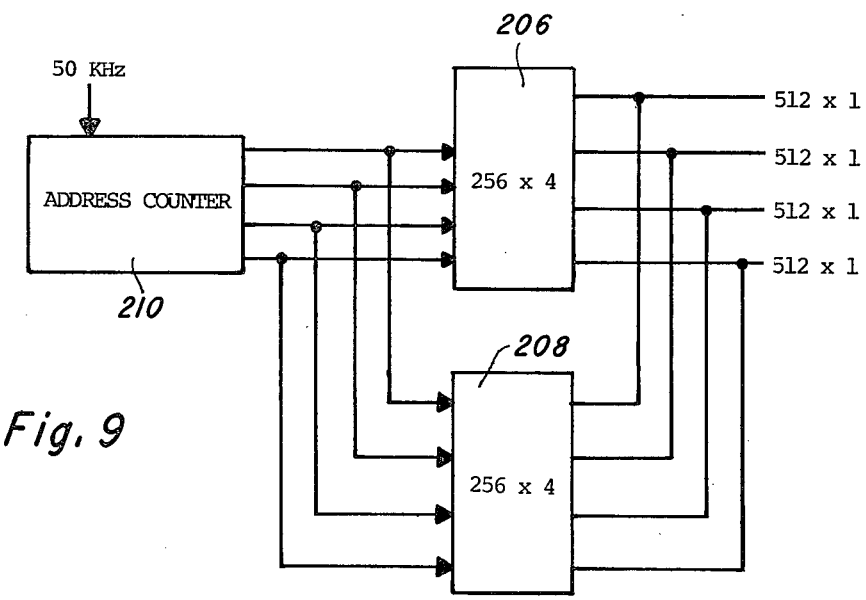
FIG. 9 illustrates an embodiment of the present invention wherein a programmable read only memory includes a memory location for each minor loop of the memory system.

In FIG. 9 there is illustrated in block diagram format a redundancy configuration which is particularly useful for large memory organizations. In the embodiment illustrated in FIG. 9, for purposes of illustration only, two programmable read only memories, 206, 208, having a data configuration of 256 words with 4 bits each is illustrated. An address counter 219 sequentially addresses the memory locations of the programmable read only memory. The outputs from the read only programmable memory are connected together to provide on each output line the equivalent of a memory organization of 512 bits by 1. In a configuration as illustrated in FIG. 9, each minor loop of a magnetic domain bubble chip would have associated therewith 1 bit of the programmable read only memory. The programmable read only memory would contain either a logic 1 or a logic 0. For one logic level, an enable signal would be provided to permit magnetic domains to be shifted into or out of the minor loop associated therewith. For the other logic level, however, the enable signal would not be present and magnetic domains would be inhibited from being shifted into or out of the minor subject loop. An advantage of this configuration is that it is not necessary to have a skip distance counter as required in the configurations previously described.

While the present invention has been described in relation to specific embodiments, it should be apparent to those skilled in the art that various modifications may be made without departing from the spirit or scope of the present invention.

What is claimed is:

1. In a thin magnetic film memory system which includes at least one thin magnetic film capable of supporting magnetic domains responsive to a control means for controllably positioning said magnetic domains in said film from one storage position to another storage position, said film including at least one defective portion such that magnetic domains cannot be positioned therein, a programmable read-only memory for recording the locations of said at least one defective portion, said programmable read-only memory being coupled to said control means for providing signals thereto effective to prevent the use of said defective portions for memory storage.

2. A thin magnetic film memory system as set forth in claim 1, further including variable delay means coupled to the output of said programmable read-only memory, said variable delay means effective to provide an output signal to said control means responsive to the output from said programmable read-only memory, said output signal effective to inhibit transfer of magnetic domains into or out of portions of said film associated in time with the occurrence of said output signal.

3. A thin magnetic film memory system as set forth in claim 2, wherein each address location of said programmable read-only memory is effective to store binary data corresponding to the number of storage positions between a first defective storage position and a second defective storage position, the binary data stored at each programmable read-only memory address providing signals effective to control said variable delay means such that said output signal is provided after a predetermined delay which corresponds in time to the number of storage positions between first and second defective positions.

4. A magnetic domain memory system comprising:
a thin magnetic film suitable for use in generating magnetic domains;
means disposed on said magnetic film for defining a major path for propagating magnetic domains; and
a plurality of minor magnetic domain propagation loops adjacent said path, one or more of said minor loops being inoperable, means for transferring magnetic domains between said minor loops and said major path; and
a programmable read-only memory for storing the locations of said one or more inoperable loops, said programmable read-only memory providing output signals effective to inhibit transfer of magnetic domains into or out of said one or more inoperable loops.

5. A magnetic domain memory system including:
a plurality of magnetic domain data chips each having a major magnetic domain propagation path means and a plurality of minor loops for propagating magnetic domains, at least one of said minor loops being inoperative for propagating magnetic domains;
control means for propagating magnetic domains around each of said major path means and around said loops at a selected clock frequency and controlling transfer of data in the form of magnetic domains between said minor loops and said major path means;
a programmable read-only memory connected to said control means for storing the relative location of each defective minor loop on each of said data chips, the output of each address of said programmable read-only memory providing a binary code corresponding to the time delay between defective minor loops; and
counter means coupled to the output of said programmable read-only memory, said counter means providing an output pulse, said output pulse being coupled to said control means for inhibiting any read or write operations during the time interval associated with said output pulse, said counter means providing said output pulse responsive to the output of said programmable read-only memory, said output pulse being delayed in time from application of said programmable read-only memory output by a time corresponding to the binary code present at the programmable read-only memory output.

6. A magnetic domain memory system as set forth in claim 5, further including an address counter connected to said programmable read-only memory for sequentially selecting memory locations thereof.

7. A magnetic domain memory system as set forth in claim 6, further including logic means coupled to the output of said counter means, said logic means operably responsive to said output pulse for providing an inhibit signal to said control means for preventing any read or write operation and for generating a clock signal for said address counter for selecting a new address of said programmable read-only memory and for providing an enable signal to said counter means for enabling transfer of the contents of said new address of said programmable read-only memory into said counter means.

8. A magnetic domain memory system including:
a plurality of magnetic domain memory modules, each module respectively including a plurality of magnetic domain chips;
control means associated with each of said chips for propagating magnetic domains, said control means including sensors for detecting the presence or absence of magnetic domains and generators for writing in new magnetic domains, each of said chips including a major magnetic domain propagation path and a plurality of minor loop propagation paths associated therewith, one or more of said minor loops of at least one chip being defective;
a programmable read-only memory coupled to said plurality of memory modules and said control means, said programmable read-only memory storing the location of the defective minor loops in each chip;
first storage means coupled to said plurality of modules for transferring data in parallel between said plurality of modules and said first storage means;
second storage means coupled to an output terminal for transferring data in parallel between said output terminal and said second storage means;
said first and second storage means coupled together by serial data transfer means, said first and second storage means further coupled to the output of said programmable read only memory whereby serial data transfer between said first and second storage means is prevented during transfer times corresponding to the location of a defective minor loop.

9. A magnetic domain memory system as set forth in claim 8, wherein said first and second storage means respectively comprise parallel to serial shift registers.

10. A magnetic domain memory system as set forth in claim 8, including counter means connected to the output of said programmable read only memory for providing a signal to said first and second storage means for inhibiting transfer of data therebetween.

11. A magnetic domain memory system including a thin magnetic film suitable for use in generating magnetic domains, means disposed on said magnetic film for defining a major path for propagating magnetic domains and a plurality of minor magnetic domain propagation loops adjacent said major path, one or more of said minor loops being inoperable, means for transferring magnetic domains between said minor loops and said major path, and a programmable read-only memory having a storage location corresponding to each of said minor loops, programmable read-only memory storage locations associated with operative minor loops containing signals of a first logic level and programmable read-only memory storage locations associated with inoperative minor loops containing signals of a second logic level, a signal of said second logic level being effective to inhibit the transfer of magnetic domains into or out of the minor loop associated therewith.

* * * * *